(12) United States Patent
Kaczynski

(10) Patent No.: US 6,960,755 B2
(45) Date of Patent: Nov. 1, 2005

(54) CONTACT SENSOR, AND APPARATUS FOR PROTECTING A PROTRUDING COMPONENT

(75) Inventor: Ulrich Kaczynski, Bad Nauheim (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 166 days.

(21) Appl. No.: 10/046,273

(22) Filed: Jan. 16, 2002

(65) Prior Publication Data

US 2002/0109077 A1 Aug. 15, 2002

(30) Foreign Application Priority Data

Feb. 14, 2001 (DE) .......................... 101 06 699

(51) Int. Cl.⁷ .............................. G01J 5/08; G01J 1/04
(52) U.S. Cl. .................................. 250/221; 250/227.11
(58) Field of Search ........................ 250/221, 227.11, 250/227.24, 227.14, 222.1; 359/159; 73/504.12

(56) References Cited

U.S. PATENT DOCUMENTS

| | | | | |
|---|---|---|---|---|
| 3,842,257 A | * | 10/1974 | Kohler ...................... 250/206 |
| 3,967,135 A | * | 6/1976 | Balban et al. .............. 307/121 |
| 4,293,188 A | * | 10/1981 | McMahon ................... 385/13 |
| 4,378,144 A | * | 3/1983 | Duck et al. | |
| 4,388,613 A | * | 6/1983 | Rush et al. .................... 341/14 |
| 4,596,925 A | * | 6/1986 | Gilby ..................... 250/227.21 |
| 4,651,571 A | * | 3/1987 | McGlade | |
| 4,690,001 A | * | 9/1987 | Harvey et al. ................. 73/800 |
| 4,792,206 A | * | 12/1988 | Skuratovsky ............... 385/137 |
| 4,806,016 A | * | 2/1989 | Corpron et al. | |
| 4,896,935 A | * | 1/1990 | Lee | |
| 5,038,618 A | * | 8/1991 | Malvern | |
| 5,414,785 A | * | 5/1995 | Bergmann .................... 385/24 |
| 5,422,969 A | * | 6/1995 | Eno ............................. 385/54 |
| 5,502,301 A | * | 3/1996 | Lord ..................... 250/227.14 |
| 5,604,313 A | * | 2/1997 | Cahill et al. | |
| 5,664,034 A | * | 9/1997 | Mock | |
| 5,917,180 A | * | 6/1999 | Reimer et al. ......... 250/227.14 |
| 6,263,733 B1 | * | 7/2001 | Reimer et al. | |
| 6,337,653 B1 | * | 1/2002 | Buchler et al. ............... 342/72 |
| 6,473,170 B2 | * | 10/2002 | Schafer ................... 356/240.1 |
| 6,511,222 B1 | * | 1/2003 | Bouamra | |
| 6,607,212 B1 | * | 8/2003 | Reimer et al. .............. 280/735 |
| 2002/0052470 A1 | * | 5/2002 | Konradi et al. ............. 530/331 |
| 2003/0048607 A1 | * | 3/2003 | Ives et al. | |
| 2003/0178556 A1 | * | 9/2003 | Tachi et al. ............ 250/227.11 |
| 2004/0129868 A1 | * | 7/2004 | Kilmartin .............. 250/227.14 |
| 2005/0029436 A1 | * | 2/2005 | McElfresh et al. ......... 250/225 |
| 2005/0082466 A1 | * | 4/2005 | Smith et al. ........... 250/227.11 |

FOREIGN PATENT DOCUMENTS

| | | | |
|---|---|---|---|
| DE | 37 00 009 | 7/1988 | |
| DE | 42 34 375 | 4/1994 | |
| EP | 0473100 A1 | * 3/1992 | .......... H01L/12/40 |
| EP | 0456681 B1 | * 3/1994 | .......... G01P/15/08 |
| GB | 2185359 A | * 7/1987 | .......... H03M/1/22 |

* cited by examiner

*Primary Examiner*—Gail Verbitsky
(74) *Attorney, Agent, or Firm*—Foley & Lardner LLP

(57) ABSTRACT

The invention discloses a contact sensor having a movably arranged impact detection element spaced away from a stationary housing part; and having a detection system that contains a light source with an emission surface as well as a receiving element, defining a receiving surface, arranged opposite the emission surface of the light source wherein the receiving surface and emission surface are of substantially the same size. Furthermore a a high-precision measurement machine and an apparatus for protecting a protruding component are disclosed.

18 Claims, 6 Drawing Sheets

CONTACT SENSOR, AND APPARATUS FOR PROTECTING A PROTRUDING COMPONENT

CROSS REFERENCE TO RELATED APPLICATIONS

This invention claims priority of the German patent application 101 06 699. 6-42 which is incorporated by reference herein.

FIELD OF THE INVENTION

The invention concerns a contact sensor and an apparatus for protecting a protruding component.

BACKGROUND OF THE INVENTION

Apparatuses that detect the approach of a moving component toward surrounding components, in order to prevent an imminent collision that might damage the components, are widely known. Contact switches, which are available in many configurations, may be used as an extremely simple embodiment.

DE 42 34 375 discloses an apparatus for protecting personnel and preventing collisions of driverless forklift vehicles, which comprises a light barrier between the tine tips of the lifting fork.

Unexamined Application DE 37 00 009 A1 discloses an optoelectronic safety zone apparatus for protecting moving or stationary objects from improper contact 0or collision, in which an optoelectronic distance sensor, which sweeps a light beam over an adjustable angular range, is used. By ascertaining the size of the light beam spot on surrounding objects, conclusions are drawn as to the distance; if it falls below a safe distance, a signal is outputted.

The known apparatuses have the disadvantage that initially they can sense relative approaches only from one direction. Only by pivoting the apparatus or by using several apparatuses oriented for different directions can approaches from different directions be sensed.

Particularly when additional pivoting or complex sensing and analysis of measured values (for example determination of a light spot size) is necessary, switching delays occur during which the undesired approach continues.

Contact switches can be configured in such a way that they have short switching travels. They have, however, the previously mentioned disadvantage that they sense approaches only from one direction. In addition, contact switches have a very large physical extension compared to the switching travel, in exactly that direction. Especially when contact switches must be used for all spatial directions, movement clearance is greatly restricted or additional space must be provided.

In an ultrahigh-accuracy coordinate measuring machine, a very heavy X/Y measurement stage made of Cerodur, sliding on an air bearing and carrying a specimen whose features are to be measured, is displaced with an accuracy of a few nanometers. With a measurement machine of this kind, for example, feature widths or feature spacings of a wafer exposure mask can be determined. The relative position of the X/Y measurement stage is measured interferometrically. An objective is arranged above the specimen, and a condenser below the specimen. The specimen can be examined microscopically in both an incident-light and a transmitted-light configuration. Contact sensors must be implemented in order to protect protruding components from, in particular, collisions with the heavy X/Y measurement stage.

The components of an ultrahigh-accuracy coordinate measuring machine of this kind are manufactured from very expensive materials that are difficult to machine.

The components, in particular the measurement stage, should therefore be no larger than necessary. A space-saving configuration must also be selected in view of the high cost of the clean-room space in which such measurement machines are installed. In this context, the use of contact sensors or contact switches that require a great deal of installation space is disadvantageous.

SUMMARY OF THE INVENTION

It is therefore an object of the present invention to describe a contact sensor, which is sensitive for contacts or impacts from several directions and which operates quickly and is reliable.

The above object is achieved by a contact sensor comprising: an impact element movably connected to a housing part, a light source defining an emission surface, a receiving element defining a receiving surface arranged opposite the emission surface of the light source.

It is furthermore an object of the present invention to create an apparatus for protecting a protruding component which operates quickly and reliable.

The aforesaid object is achieved by an apparatus comprising a housing part to which the protruding component is connected, an impact element movably connected to the housing part, a light source defining an emission surface, a receiving element defining a receiving surface arranged opposite the emission surface of the light source.

It is an other object of the invention to create an a high-precision measurement machine, which avoids the damage of optical components.

The aforesaid object is achieved by a high-precision measurement machine comprising a housing part to which a optical component is connected, an impact element movably connected to the housing part, a light source defining an emission surface, a receiving element defining a receiving surface arranged opposite the emission surface of the light source.

The contact sensor according to the present invention has the advantage that contacts from a variety of directions can be detected without a great deal of equipment complexity, for example pivoting or duplication of the sensor.

The contact sensor is preferably configured such that in the event of even very small displacements of the impact detection element, the light path between the emission surface and receiving surface is interrupted. For that purpose, the emission surface and receiving surface are configured to be as small as possible. The length of the switching path is then of the same order as the diameter of the emission surface or receiving surface. In a very particularly preferred embodiment, the emission surface is defined by the end of at least one light-guiding fiber. The light-guiding fiber simultaneously transports the light of the light source. The use of a light-guiding fiber bundle is also possible, the exit surfaces of the individual light-guiding fibers of the light-guiding fiber bundle then defining the emission surface.

In a simple embodiment of the contact sensor according to the present invention, an intensity sensor is associated with the receiving surface. This can be, for example, a semiconductor detector, a photodiode, or a photomultiplier. A further light-guiding fiber or a further light-guiding fiber bundle can be arranged between the receiving surface and the intensity sensor. The light source can be, for example, a laser, a light-emitting diode, or an incandescent lamp. Preferably a semiconductor laser is used.

In a particular embodiment, the receiving surface is a reflective surface that directs the light emitted from the emission surface onto at least one further emission surface that is defined by the cross section of a light-guiding fiber. Said light-guiding fiber transports the light to the intensity sensor.

The impact detection element can be movably connected to the housing part in various ways. Preferably the connection comprises one or more elastically bendable rods. The rod is preferably connected to the housing part via a baseplate, which makes the contact sensor easier to assemble.

The impact detection element, the baseplate and its connection (for example, the at least one rod), and the receiving element can be manufactured together in a single piece. In a further preferred embodiment, the light source is mounted on the baseplate.

Preferably the receiving surface and emission surface are arranged one directly above another. Since the light bundle emerging from the light-guiding fiber end is highly divergent, to prevent light losses it is advantageous to configure the contact sensor in such a way that the light path between receiving surface and emission surface is smaller than the cross section of the emission surface. Instead of this, however, it is also possible to arrange between the receiving surface and emission surface an optical system that, for example, focuses the light proceeding from the emission surface onto the receiving surface.

The intensity sensor generates an electrical signal proportional to the power level of the light striking the emission surface. Said signal can serve to control the movement sequence that has caused the contact against the impact detection element and thus the electrical signal. In the simplest case, the movement is stopped. The movement speed can also be reduced by being controlled in open- or closed-loop fashion or can be monitored.

If the emission surface and receiving surface are sufficiently large, a small displacement of the impact detection element can bring about only a partial interruption of the light path between the emission surface and receiving surface, which is expressed as a decrease in the amplitude of the electrical signal. From the change in amplitude, conclusions can be drawn as to the distance over which the impact detection element was displaced.

In a particular embodiment of the apparatus for protecting a protruding component, the impact detection element at least partially surrounds the component to be protected.

In very particularly advantageous fashion, the apparatus according to the present invention can be used in a high-precision measurement machine. Since the impact detection element can be configured in very space-saving fashion, no additional space is required; not the least of the results is that the production complexity and production costs of the measurement machine are greatly reduced.

In a specific embodiment, the impact detection element surrounds the condenser of a high-precision measurement machine and, by outputting a signal that stops the movement operation, protects the condenser from collisions with the heavy X/Y measurement stage.

BRIEF DESCRIPTION OF THE DRAWINGS

The subject matter of the invention is depicted schematically in the drawings, and will be described below with reference to the Figures, in which.

DETAILED DESCRIPTION OF THE INVENTION

Figure 1:
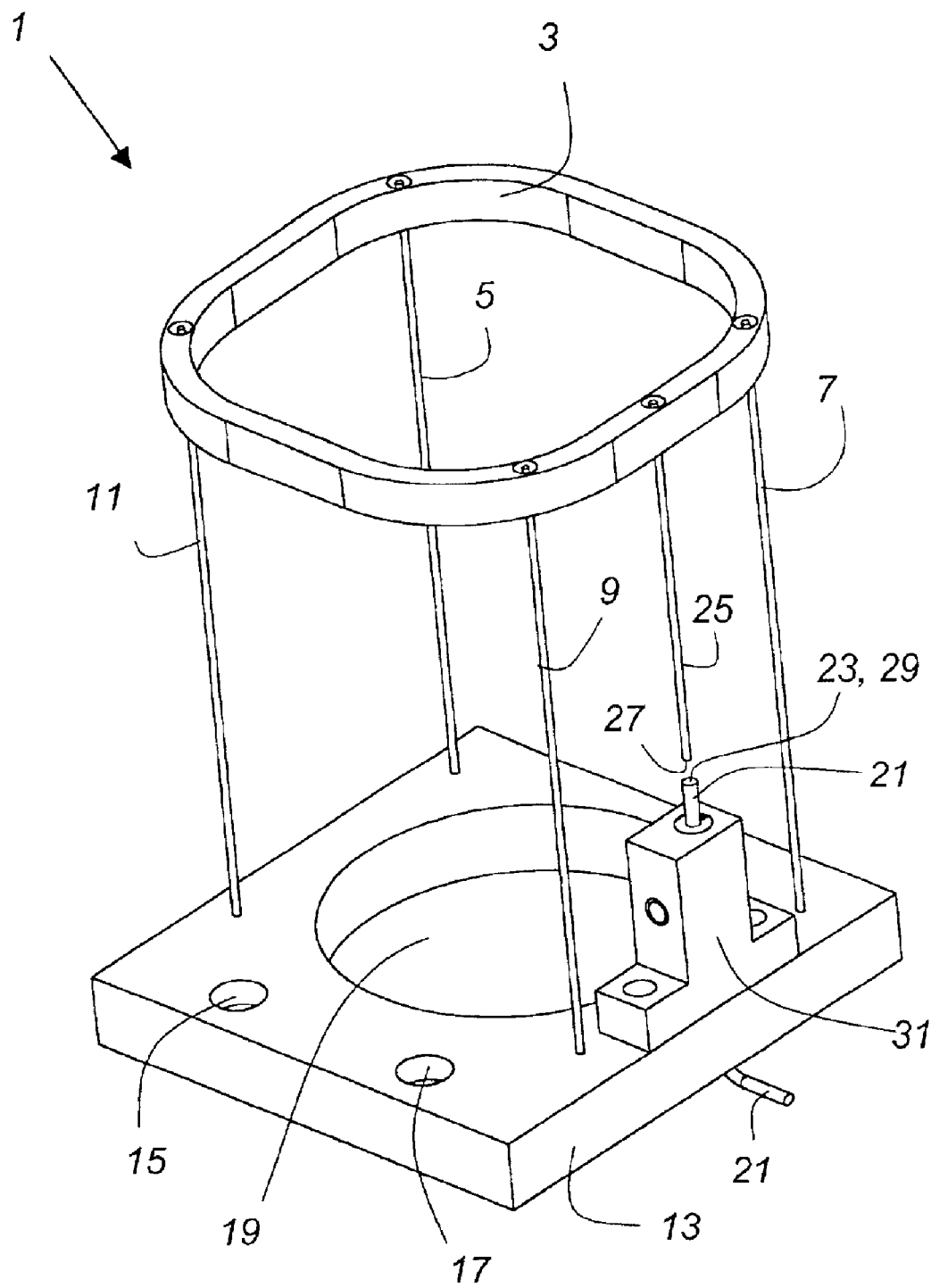
FIG. 1 shows an embodiment of the contact sensor in a three-dimensional perspective view.

FIG. 1 shows a contact sensor 1 according to the present invention. Impact detection element 3 is movably connected, via four flexible steel rods 5, 7, 9, 11, to a baseplate 13. Baseplate 13 has a first orifice 15 and a second orifice 17 for mounting onto a housing part (not shown in this Figure), as well as an opening 19 that, together with impact detection element 3, surrounds a space into which a protruding component is introduced. A light-guiding fiber bundle 21 is guided through baseplate 13. A first half of the light-guiding fibers of light-guiding fiber bundle 21 transports the light of a light source (not shown here) to emission surface 23, which is formed by the end surfaces of the first half of the light-guiding fibers of the light-guiding fiber bundle. A further steel rod, whose reflective end surface forms a first receiving surface 27, serves as receiving element 25.

Figure 5:
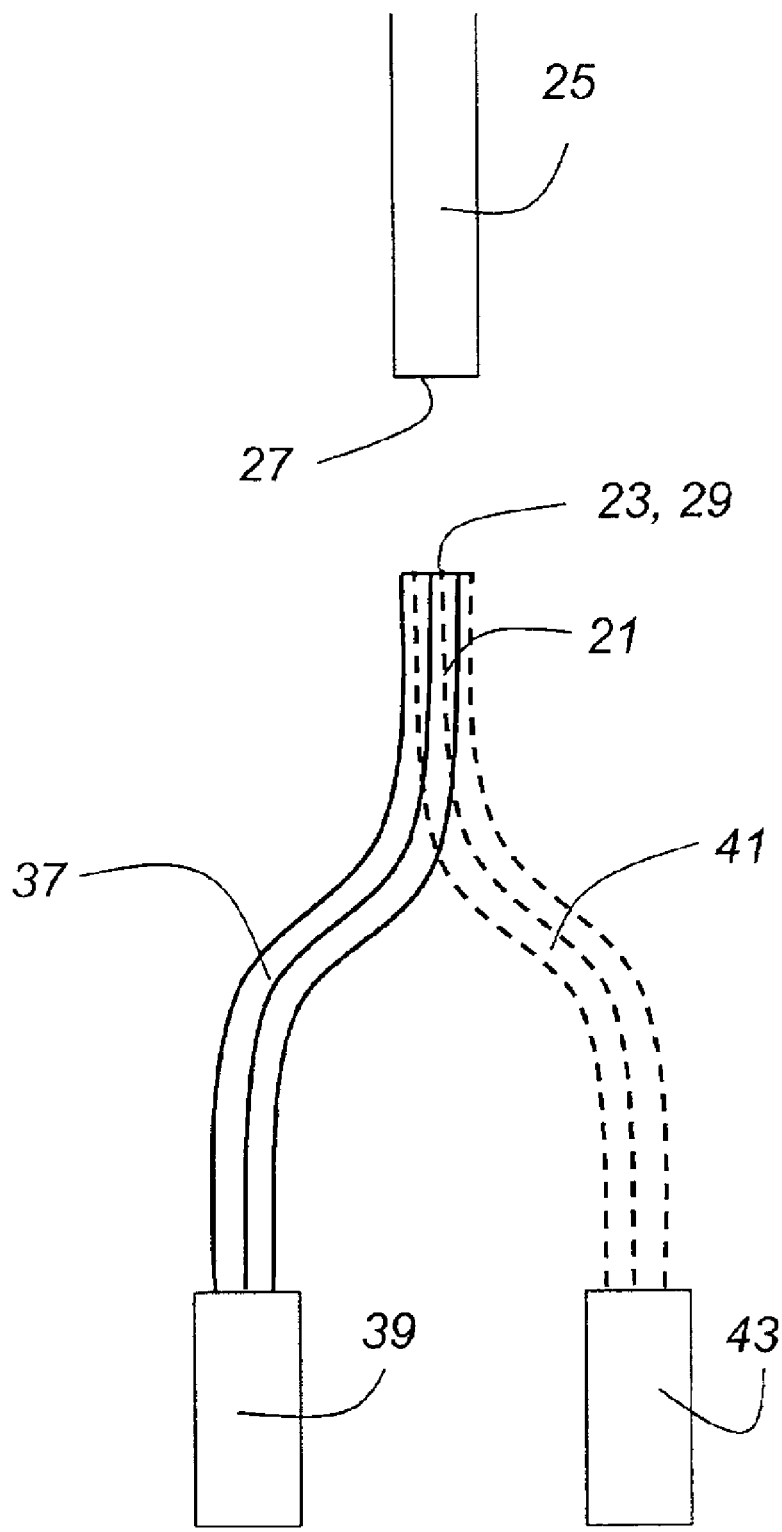
FIG. 5 shows the detection system of the contact sensor.

Receiving surface 27 is arranged opposite emission surface 23. The end surfaces of the second half of the light-guiding fibers of the light-guiding fiber bundle form a further receiving surface 29. The light proceeding from emission surface 23 therefore first arrives at first receiving surface 27 and is reflected there to further receiving surface 29. The light is guided through the second half of the light-guiding fibers of light-guiding fiber bundle 21 to an intensity sensor (not shown here). The layout of the first and second halves of the light-guiding fibers of light-guiding fiber bundle 21 is depicted in FIG. 5. A retaining block 31, through which fiber optic bundle 21 extends and in which it is adhesively bonded, is installed in order to immobilize fiber optic bundle 21.

Figure 2:
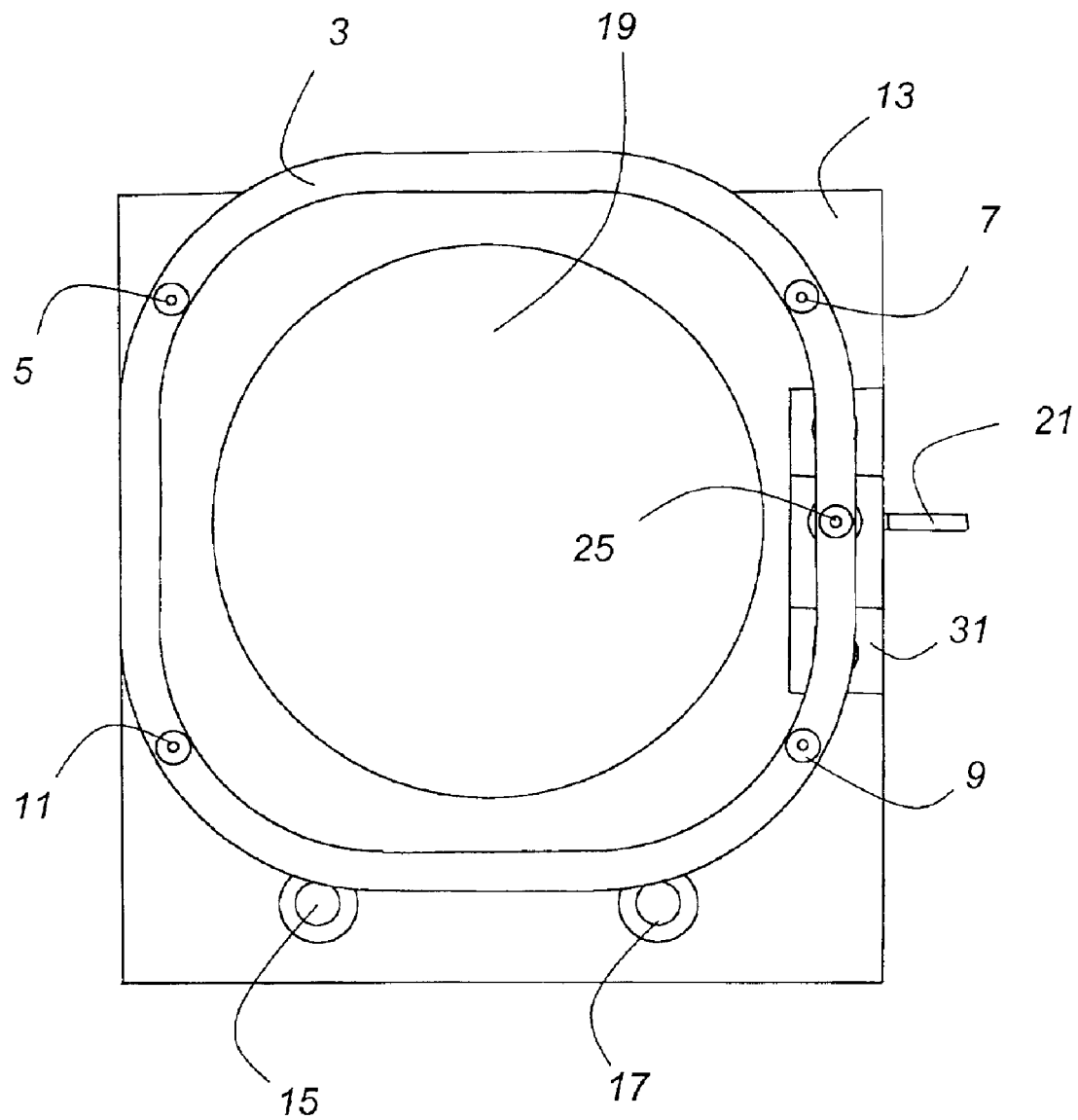
FIG. 2 shows the contact sensor of FIG. 1 in a plan view.

FIG. 2 shows contact sensor 1 in a plan view. Steel rods 5, 7, 9, 11 and receiving element 25 are soldered into impact detection element 3.

Figure 3:
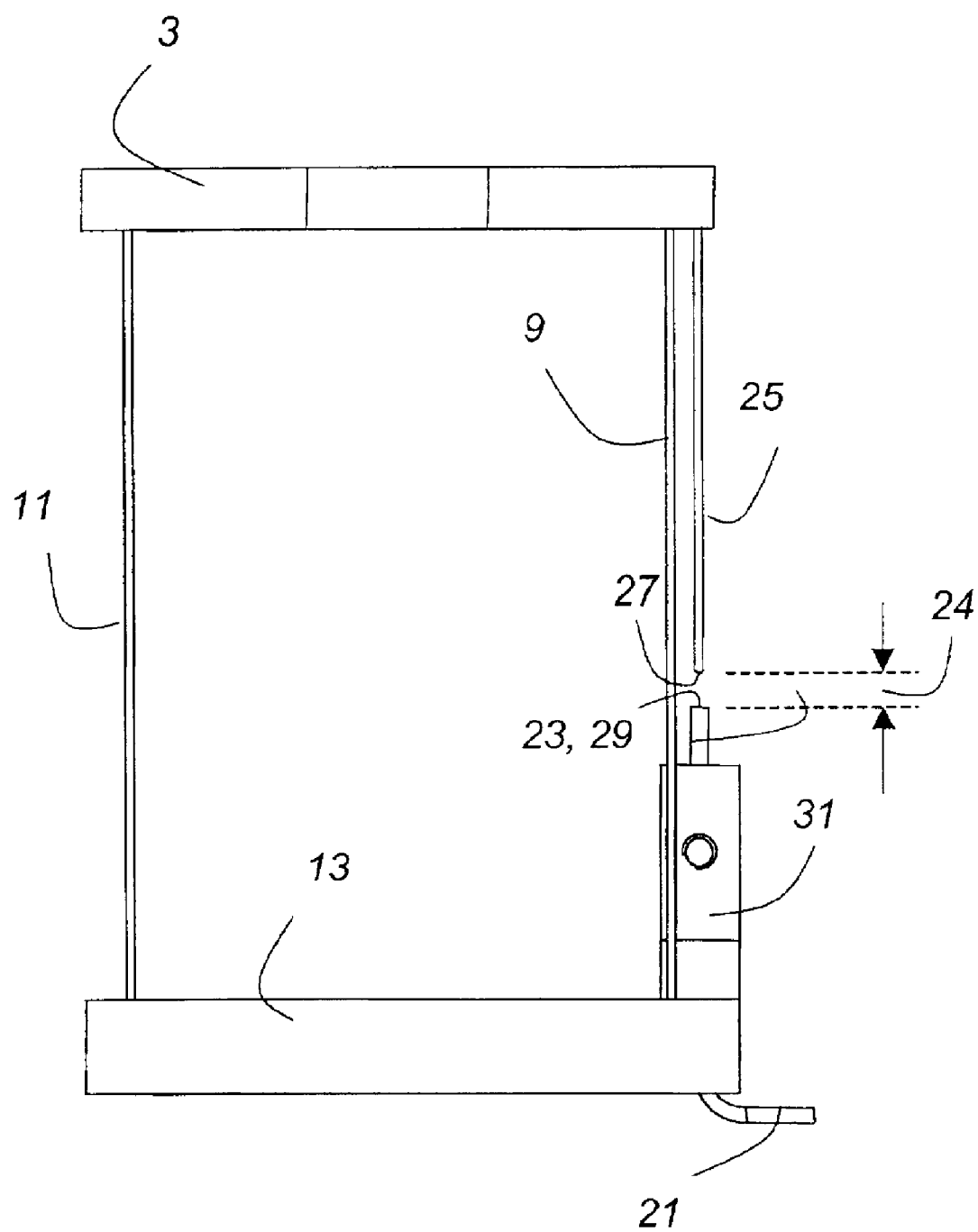
FIG. 3 shows the contact sensor of FIG. 1 in a side view.

FIG. 3 shows contact sensor 1 in a side view. In the initial state, receiving surface 27 is located opposite emission surface 23.

Figure 4:
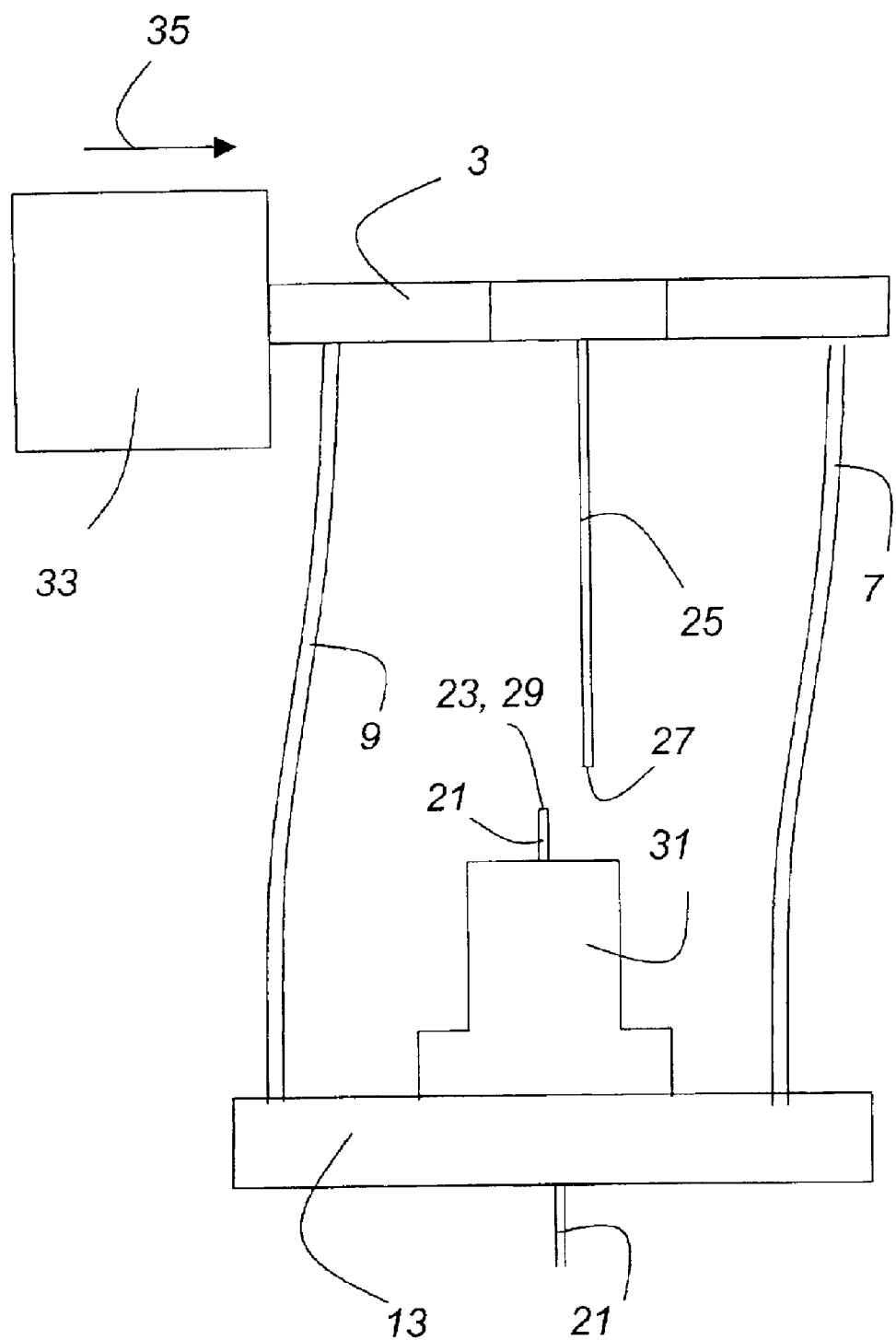
FIG. 4 shows the contact sensor of FIG. 1 in a side view, upon collision with a component.

FIG. 4 shows contact sensor 1 in a side view, upon collision with a component 33 that moves, in the direction indicated with directional arrow 35, toward impact detection element 3 of contact sensor 1. As a result of the displacement of impact detection element 3, receiving element 25 along with receiving surface 27 is also displaced laterally out of the initial position, so that it is no longer located opposite the emission surface and thus no longer reflects light. Accordingly, no light arrives at further receiving surface 29 or, therefore, at the intensity sensor. The change in the measured intensity is detected and results, by way of an electronic circuit (not depicted here) in stoppage of the movement of component 33.

FIG. 5 shows the detection system of the contact sensor according to the present invention. A first half of the light-guiding fibers 37 of light-guiding fiber bundle 21 transports the light of a light source 39 to emission surface 23, which is formed by the end surfaces of the first half of light-guiding fibers 37 of light-guiding fiber bundle 21. Steel rod 25, whose reflective end surface forms first receiving surface 27, serves as receiving element 25. First receiving surface 27 is arranged opposite emission surface 23. The end surfaces of the second half of light-guiding fibers 41 of light-guiding fiber bundle 21 form a further receiving surface 29. The light proceeding from emission surface 23 thus first arrives at first receiving surface 27 and is reflected there to further receiving surface 29. The light is guided through the second half of light-guiding fibers 41 of light-guiding fiber bundle 21 to an intensity sensor 43. Fiber optic bundle 21 is guided in a single bundle in the region of emission and receiving surfaces 23, 29, and after a certain distance splits into first and second halves 37, 41 of light-guiding fiber bundle 21. The intensity sensor is configured as a photo-diode that generates an electrical signal, proportional to the power level of the incoming light, which is further processed electronically. In this exemplary embodiment, the light source comprises a diode laser.

Figure 6:
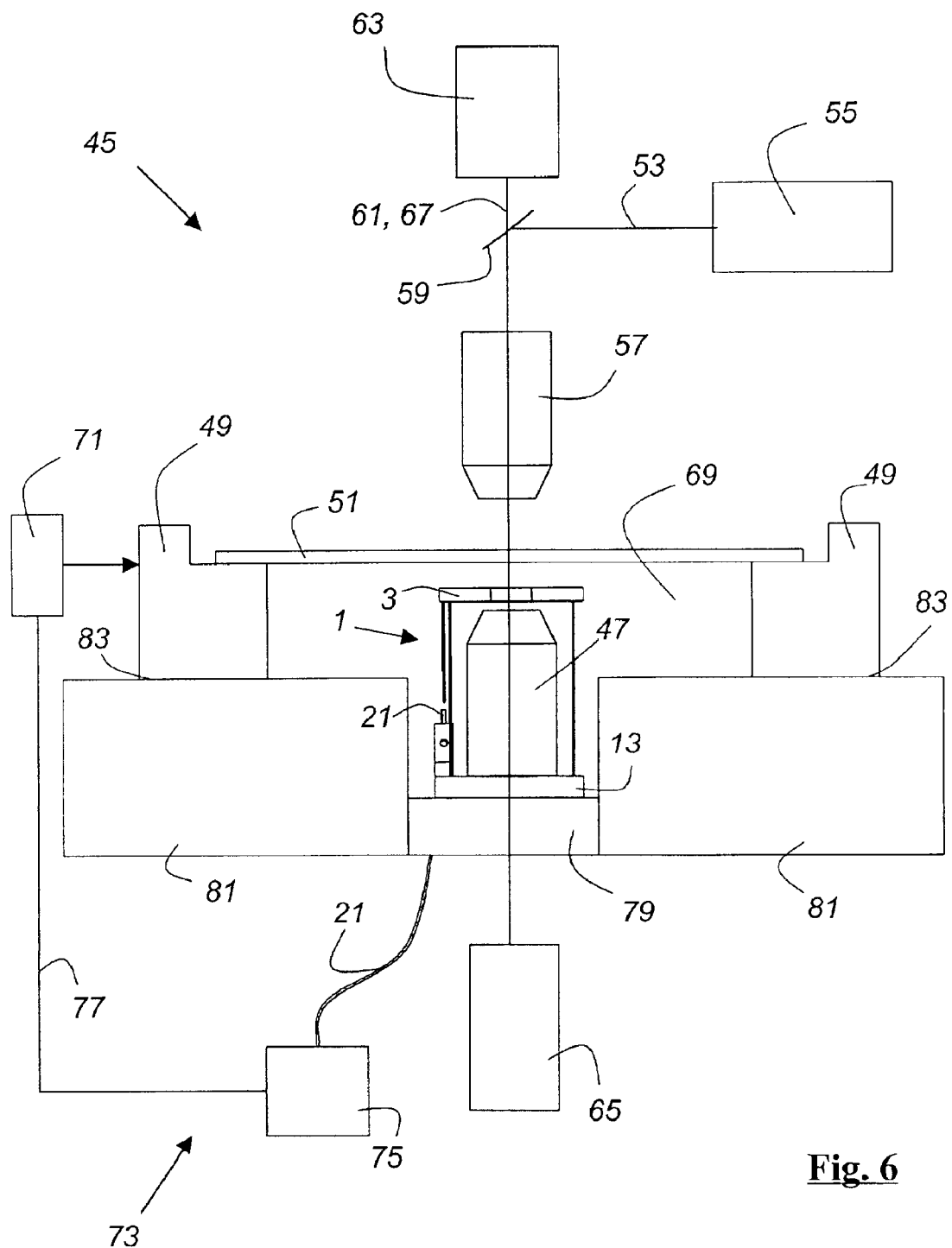
FIG. 6 shows a high-precision measurement machine having an apparatus for protecting the condenser.

FIG. 6 shows a high-precision measurement machine 45 having an apparatus for protecting a condenser 47. In ultrahigh-accuracy coordinate measuring machine 45, a very heavy X/Y measurement stage 49, which slides on an air bearing and is produced from Cerodur and which carries a specimen 51 whose features are to be measured, is displaced with an accuracy of a few nanometers relative to a microscope optical system. The relative position of the X/Y measurement stage 49 is measured interferometrically. Specimen 51 can be examined microscopically in both an incident-light and a transmitted-light configuration. In incident-light examination, specimen 51 is illuminated with light 53 of a first light source 55 through a microscope objective 57. Arranged between first light source 55 and microscope objective 57 is a beam splitter 59 that reflects light 53 coming from first light source 55 to the microscope objective, and allows light 61 emerging from specimen 51 to pass, so that it arrives at a detector 63 that is embodied as a photomultiplier. Specimen 51 is scanned by displacement of the X/Y measurement stage. In the transmitted-light configuration, specimen 51 is illuminated from below by a second light source 65 through condenser 47. Transmitted light 67 is detected in detector 63.

X/Y measurement stage 49 has in its inner region an opening 69 within which condenser 47 can be guided close to specimen 51 resting on the edge. The condenser is mounted on a housing part 79. The X/Y measurement stage is driven by an electric motor 71, and slides on an air bearing 83 that is configured between the X/Y measurement stage and a plane-polished granite table 81. Since the movement range of the X/Y measurement stage is larger than opening 69 in the inner region, collisions could occur between condenser 47 and the X/Y measurement stage. To prevent any collision, an apparatus for the protection 73 of condenser 47, containing a contact sensor 1, is provided. Because of the compact design of contact sensor 1, in particular of impact detection element 3, the freedom of movement of the X/Y measurement stage is restricted at most insignificantly. The contact sensor corresponds in terms of configuration to that illustrated in FIG. 1 through FIG. 5. The apparatus for the protection 73 of condenser 47, which is mounted by way of a baseplate 13 on housing part 79, contains a control unit 75 in which a light source 39 and an intensity sensor are implemented. As already described, the light of the light source passes through the first half of light-guiding fibers 37 of light-guiding fiber bundle 21 to emission surface 23. The light proceeding from receiving surface 27, 29 passes through the second half of light-guiding fibers 41 of light-guiding fiber bundle 21 to control unit 75, and therein to intensity sensor 43. In the event of a decrease in the intensity signal, a stop signal is conveyed via line 77 to electric motor 71.

The present invention was described with reference to a particular exemplary embodiment. It is nevertheless self-evident that changes and modifications can be made without thereby leaving the range of protection of the claims recited hereinafter.

What is claimed is:

1. An apparatus for protecting a protruding component comprising:
   a housing part to which the protruding component is connected;
   an impact detection element movably connected to the housing part via at least one elastically bendable rod;
   a light source coupled to the housing part defining an emission surface; and
   a receiving element coupled to the impact detection element defining a receiving surface arranged opposite the emission surface of the light source.

2. The apparatus according to claim 1, wherein the receiving surface and emission surface are of substantially the same size.

3. The apparatus according to claim 1, wherein the impact detection element surrounds at least partially the protruding component to be protected.

4. The apparatus according to claim 1, wherein the light source comprises at least one light-guiding fiber, and the emission surface is defined by the end of the light-guiding fiber.

5. The apparatus according to claim 1, further comprising an intensity sensor, which is associated with the receiving surface.

6. The apparatus according to claim 5, wherein the intensity sensor generates an electrical signal corresponding to the power level of the light striking the receiving surface, which serves for open-loop or closed-loop control or monitoring of a movement operation.

7. The apparatus according to claim 1, wherein the receiving surface is a reflective surface that directs the light emitted from the emission surface onto at least one further light-guiding fiber, connected to an intensity sensor, whose end defines a further receiving surface.

8. The apparatus according to claim 1, wherein a light path between the receiving surface and the emission surface is smaller than a cross section of the emission surface.

9. The apparatus according to claim 1, wherein the apparatus is configured so that, during a non-collision, light emitted from the light source is received at the receiving surface and, during a collision, light emitted from the light source is not received at the receiving surface.

10. An apparatus for protecting a protruding component comprising:
    a housing part to which the protruding component is connected;
    an impact detection element movably connected to the housing part via at least one elastically bendable rod;
    a light source coupled to the impact detection element defining an emission surface; and
    a receiving element coupled to the housing part defining a receiving surface arranged opposite the emission surface of the light source.

11. The apparatus according to claim 10, wherein the receiving surface and emission surface are of substantially the same size.

12. The apparatus according to claim 10, wherein the impact detection element surrounds at least partially the protruding component to be protected.

13. The apparatus according to claim 10, wherein the light source comprises at least one light-guiding fiber, and the emission surface is defined by the end of the light-guiding fiber.

14. The apparatus according to claim 10, further comprising an intensity sensor, which is associated with the receiving surface.

15. The apparatus according to claim 14, wherein the intensity sensor generates an electrical signal corresponding to the power level of the light striking the receiving surface, which serves for open-loop or closed-loop control or monitoring of a movement operation.

16. The apparatus according to claim 10, wherein the receiving surface is a reflective surface that directs the light emitted from the emission surface onto at least one further light-guiding fiber, connected to an intensity sensor, whose end defines a further receiving surface.

17. The apparatus according to claim 10, wherein a light path between the receiving surface and the emission surface is smaller than a cross section of the emission surface.

18. The apparatus according to claim 10, wherein the apparatus is configured so that, during a non-collision, light emitted from the light source is received at the receiving surface and, during a collision, light emitted from the light source is not received at the receiving surface.

* * * * *